United States Patent [19]

Froeschle

[11] 4,456,872
[45] Jun. 26, 1984

[54] CURRENT CONTROLLED TWO-STATE MODULATION

[75] Inventor: Thomas A. Froeschle, Framingham, Mass.

[73] Assignee: Bose Corporation, Framingham, Mass.

[21] Appl. No.: 229,082

[22] Filed: Feb. 24, 1972

Related U.S. Application Data

[63] Continuation of Ser. No. 869,520, Oct. 27, 1969, abandoned.

[51] Int. Cl.³ .................... G05F 1/56; H02M 3/335
[52] U.S. Cl. .................................... 323/286; 323/267; 363/21
[58] Field of Search .................... 307/17, 31, 32, 33, 307/34, 35, 237; 321/2; 323/4, 20, 227, 38, DIG. 1, 17; 363/20, 21, 267, 281

[56] References Cited

U.S. PATENT DOCUMENTS

| | | | |
|---|---|---|---|
| 3,294,981 | 12/1966 | Bose | 307/237 |
| 3,388,318 | 6/1968 | O'Brien | 323/20 |
| 3,396,326 | 8/1968 | Kisrow | 323/20 X |
| 3,523,239 | 8/1970 | Heard | 323/20 |
| 3,562,623 | 2/1971 | Farnsworth | 323/DIG. 1 |
| 3,564,384 | 2/1971 | Adler | 321/2 |
| 3,569,818 | 3/1971 | Dahlinger et al. | 321/2 |
| 3,571,697 | 3/1971 | Phillips | 323/DIG. 1 |
| 3,585,491 | 6/1971 | Petersen | 323/20 |

OTHER PUBLICATIONS

Froeschle, "Two State Modulation Techniques for Power Systems", Research & Development Technical Report, ECOM-02282-3, Semi-Annual Report, Dec. 1967, 83 pages.
Froeschle, "Two State Modulation Techniques for Power Systems", Research & Development Technical Report, ECOM-02282-3, Semi-Annual Report, Apr. 1968, 83 pages.
Froeschle et al., "Lightweight Automatic Charger/Controller", Power Sources Conference, 1968.
"Basic Electronics," NAVPERS 10087, U.S. Government Printing Office, Washington, (1955), preface and pp. 211-219.
"McGraw-Hill Encyclopedia of Science and Technology," vol. 5, McGraw-Hill Book Company, New York City, New York (1971), pp. 214-215.

Primary Examiner—A. D. Pellinen
Attorney, Agent, or Firm—Charles Hieken

[57] ABSTRACT

In a current controlled two-state modulation system having a power switch and a low pass filter, a current sensor provides a current feedback signal representative of the current delivered by the power switch to the low pass filter. The low pass filter also provides a voltage feedback signal that is combined with a reference signal to provide a combined signal. A limiting amplifier amplifies the combined signal for further combination with the current feedback signal to provide a switching signal that is delivered to a circuit characterized by hysteresis. This circuit determines the instant when the power switch is switched so as to maintain the output voltage provided by the low pass filter substantially constant so long as the load current is less than a predetermined limiting value determined by the limiting amplifier and thereafter limits the output current to substantially the predetermined limiting value.

19 Claims, 5 Drawing Figures

CURRENT CONTROLLED TWO-STATE MODULATION

This is a continuation of application Ser. No. 869,520, filed Oct. 27, 1969 now abandoned.

BACKGROUND OF THE INVENTION

The present invention relates in general to two-state modulation and more particularly concerns a two-state modulation system embodying the principles of but representing an improvement over that disclosed in Bose U.S. Pat. No. 3,294,981 entitled SIGNAL TRANSLATION granted Dec. 27, 1966. The present invention is characterized by exceptionally good current control under all transient and steady state conditions of line and load, current limiting, a high degree of line and load regulation with stability and bandwidth, ability for paralleling with other like systems with proportional current sharing and great flexibility with respect to output circuits.

The basic two-state modulation system invented by Bose is characterized by high efficiency, ability to amplify faithfully in amplification circuits, exercise good control in feedback control systems and regulate voltage levels. The basic Bose system may include a power switch that energizes a low pass filter and is in a closed loop characterized by hysteresis that controls the instants of power switching so as to maintain the output of the low pass filter in conformity with a predetermined input, such as a reference voltage in the case of a voltage regulator, or a low level signal to be amplified in the case of an amlplifier. A distinguishing feature of the Bose two-state modulator system is that a feedback signal from the output of the power switch ahead of the low pass filter initiates switching. This distinguishing feature is responsible for many of the advantages associated with two-state modulation.

It is an important object of this invention to retain the advantages associated with two-state modulation and provide additional advantages.

It is an important object of the invention to provide improved current control in a load under a wide variety of transient and steady state conditions of line and load.

It is another object of the invention to achieve one or more of the preceding objects while providing current limiting.

It is a further object of the invention to provide one or more of the preceding objects while highly regulating line and load parameters with good stability and over a wide bandwidth.

It is another object of the invention to achieve one or more of the preceding objects with a system suitable for paralleling with like systems to achieve proportional current sharing.

It is still another object of the invention to achieve one or more of the preceding objects with a flexible system applicable to a wide variety of output requirements.

Numerous other features, objects and advantages of the invention will become apparent from the following specification when ready in connection with the accompanying drawing in which:

SUMMARY OF THE INVENTION

According to the invention, there is a two-state device having means for establishing a hysteresis characteristic and including an input and output for providing one of first and second output levels and shifting to the other only in response to a predetermined shift in the level on the input across one of first and second different threshold levels. The term "two-state" as used herein embraces devices that may shift between two different levels, such as positive and negative, and perhaps reside briefly at another level, such as zero, in between.

There is an input terminal for receiving an external signal, such as a reference potential, an a-c or other time varying signal. Means combine a current feedback signal of frequency corresponding to the rate at which the shift between said first and second levels occurs related to the current delivered from said output with the signal applied to the input terminal to provide a combined signal at the combining means output of frequency corresponding to said rate. Means couple the output of the combining means to the two-state device input to shift the two-state device output between the first and second levels when said combined signal crosses said first and second threshold levels, respectively, whereby the signal average value over a cycle of the output is representative of the signal at the input terminal. There is averaging means, and means for coupling the two-state device output to the averaging means to provide a signal having a waveform corresponding substantially to that of the signal then received by the input terminal, this means for coupling including essentially nondissipative means for blocking spectral components of the energy at the two-state device output from the averaging means which spectral components are of frequency at least as high as the rate at which the shift between the first and second levels occurs.

According to another feature of the invention there is means for providing a voltage feedback signal that is representative of the voltage at the output terminal, and limiting means for providing an output signal that is proportional to a signal related to the input signal and the voltage feedback signal when less than a predetermined limiting value and when above that value providing an output signal of substantially constant limited amplitude. The output of the limiting means combined with the current feedback signal comprises the said combined signal.

DETAILED DESCRIPTION OF PREFERRED EMBODIMENTS

Figure 1:
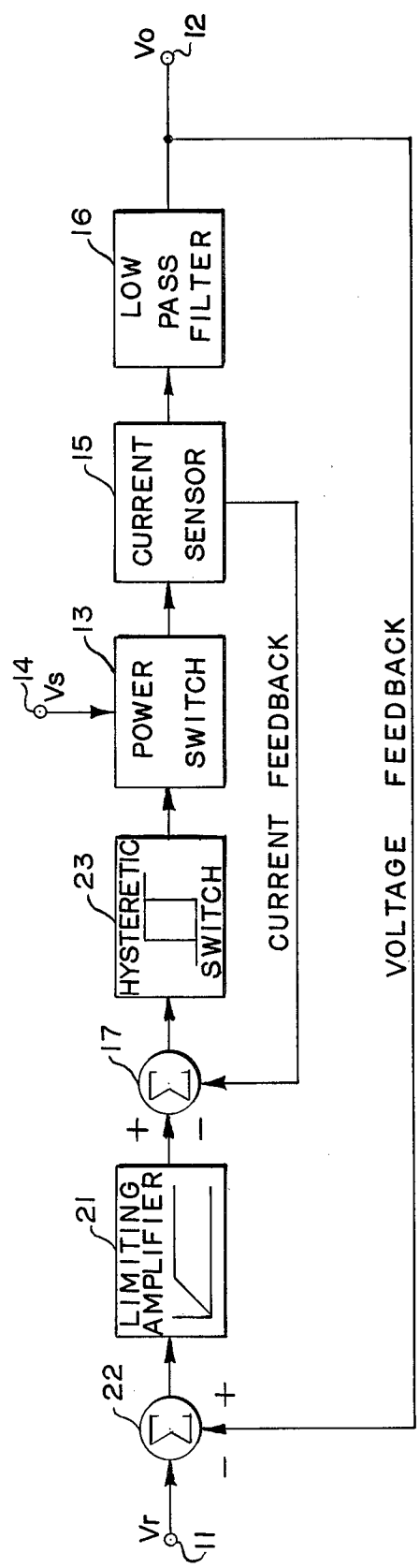
FIG. 1 is a block diagram illustrating the logical arrangement of a current-controlled two-state modulation system according to the invention.

With reference now to the drawing and more particularly FIG. 1 thereof, there is shown a block diagram illustrating the logical arrangement of a system according to the invention. The system responds to an input signal on terminal 11, typically a reference voltage $V_r$ for power processing applications, to provide an output voltage on output terminal 12 that follows changes in the input signal applied to terminal 11. This following occurs for a wide range of load currents.

A power switch 13 intermittently transfers current from a source of potential $V_s$ applied at terminal 14 through current sensor 15 and low pass filter 16 to output terminal 12. Current sensor 15 provides to the − input of summing circuit 17 a current feedback signal that is representative of the current at the switching frequency provided by power switch 13.

The + input of summing circuit 17 receives a signal from limiting amplifier 21 that, in the nonlimiting mode, is proportional to the output of summing circuit 22. The + input of summing circuit 22 receives a potential representative of the voltage on output terminal 12 that is combined with the input signal on terminal 11 applied to the − input to provide an output signal representative of the difference between the output voltage on terminal 12 and the reference voltage on terminal 11, which could be a d-c or a-c signal.

This difference voltage is amplified by limiting amplifier 21 in the linear mode to provide an output signal that is combined with the current feedback signal on the − input of summing circuit 17 to provide a switching signal that determines the instant when hysteretic switch 23 switches and thereby provides an output signal that switches power switch 13.

The inside loop comprising summing circuit 17, hysteretic switch 23, power switch 13, current sensor 15 and the current feedback line comprise a two-state modulation system of the type disclosed in Bose U.S. Pat. No. 3,294,981 and represents an improvement over that system that is particularly advantageous when controlling currents with power switches at high power levels.

Briefly, summarizing the operation of a Bose two-state system, the output of the switch is a voltage wave of rectangular waveform whose ratio of time in one state to that in the other and frequency varies so that the duration of the voltage in one of the two states relative to the immediately succeeding duration in the other state establishes an average value that tends to follow the input signal. To this end the summing circuit 17 provides a feedback signal of the switching frequency superimposed upon the input signal of much lower frequency to provide a switching signal that causes hysteretic switch 23 to change output states when the switching signal potential has changed by an increment corresponding to the width of the hysteresis characteristic to then cause power switch 13 to switch. For a more detailed discussion reference is made to the aforesaid patent and to the paper entitled A TWO-STATE MODULATION SYSTEM presented at WESCON in August 1963.

The use of current feedback according to the present invention affords certain important and unobvious advantages. Because a signal representative of the current delivered by the power switch is directly fed back to initiate switching, the current controlled system according to the invention controls the power switch current to the desired level under all transient and steady state conditions of line and load. The addition of limiting amplifier 21 limits the maximum output current to a value directly proportional to the amplitude of the limiting level. By varying this limiting level, the maximum attainable load current may be controlled.

The system is characterized by an inherent high degree of line and load regulation stability, and wide bandwidth. Both the high gain current and voltage loops in the system suppress variations caused by the input line. The gain of the voltage loop from the output suppresses variations caused by the load. The gain of this loop including the voltage feedback line from output terminal 12 to the + input of summing circuit 22 may be much higher than that of many other systems because the effect of the current feedback loop removes the stability problems usually introduced by the output filter as far as the voltage feedback loop is concerned. Stated in other words, because an effect of the current feedback loop is that the power switch delivers a substantially constant current to the input of the filter, the voltage feedback line looking into the filter sees essentially a constant filter impedance open circuited at the input end. The effectively constant current source presents a very high impedance to the input end of the filter. The gain of the voltage feedback loop can thus readily be made sufficiently high with unconditionally stable operation, such that the reference source limitations essentially determine the limitations for static regulation.

Neither the voltage nor the current feedback loops (with both loops active) experiences more than 90° phase shift because of the output circuits; therefore, wide bandwidth of the loops are easily achieved with stability. This wideband performance means that the system according to the invention responds rapidly to changes, such as transients in the line and load.

The system is especially suitable for parallelling with like systems to achieve proportional current sharing because the current feedback loop functions as a well-controlled current amplifier. Power processing units like those in FIG. 1 may be paralleled with current sharing by using a single limiting amplifier 21 whose output goes to a summing circuit like 17 in each of the parallel systems, the summing circuit 22 having its + input coupled to the connected-together output terminals like 12 in the paralleled systems.

The system has a wide range of applicability with respect to output circuits. It may be used in many different power processing circuits, including regulators, amplifiers and inverters.

Figure 2:
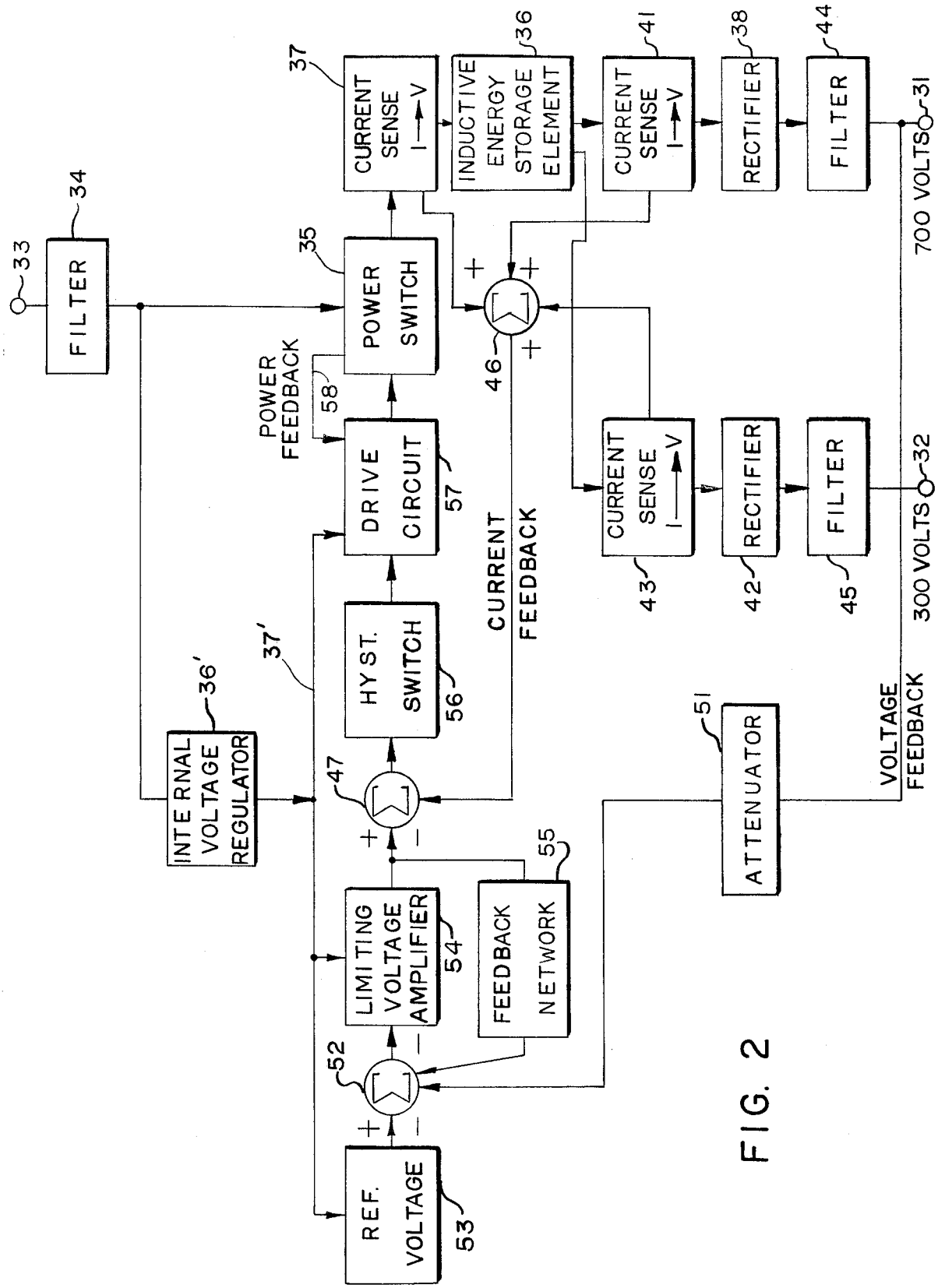
FIG. 2 is a block diagram illustrating the logical arrangement of a high voltage current regulator according to the invention.

Referring to FIG. 2, there is shown a block diagram illustrating the logical arrangement of a high voltage current regulator according to the invention arranged to provide regulated voltages of 700 volts on terminal 31 and 300 volts on terminal 32. A feature of this embodiment of the invention is that multiple currents are sensed and controlled.

An unregulated input d-c voltage is applied to terminal 33 and filtered by a filter 34. The unregulated output of filter 34 is applied to power switch 35 and to internal voltage regulator 36' that provides regulated d-c potentials on line 37' to the low power circuits in the system. Power switch 35 delivers current to inductive energy storage element 36 that is sensed by current sensor 37'. Inductive energy storage element 36 in turn delivers current to high voltage rectifier 38 that is sensed by current sensor 41 and to lower voltage rectifier 42 that is sensed by current sensor 43. The output of rectifier 38 is applied to high voltage filter 44 which provides the high voltage of 700 volts on output terminal 31. The output of low voltage rectifier 42 is applied to filter 45 which provides the low voltage of 300 volts on output terminal 32.

Current summing network 46 additively combines the signals derived from current sensors 37, 41 and 43 to provide a current feedback signal that is delivered to the − input of summing circuit 47.

The output voltage on high voltage output terminal 31 is fed back through attenuator 51 to one − input of summing circuit 52. The + input of summing circuit 52 receives a reference voltage from reference voltage source 53. Summing circuit 52 provides an output signal that is amplified by a limiting voltage amplifier 54 and fed back through feedback network 55 to the other − input of summing circuit 52.

The output of limiting voltage amplifier 54 is also applied to the + input of summing circuit 47 which adds the current feedback signal from summing network 46 to provide a switching signal that determines the instant when hysteretic switch 56 switches. The output of hysteretic switch 56 is coupled by drive circuit 57 to power switch 35. A power feedback line 58 from power switch 35 to drive circuit 57 helps accelerate the switching process.

The principle of operation of the system of FIG. 2 is substantially the same as that of the system of FIG. 1. However, there are additional elements in the system of FIG. 2, many of whose functions are apparent from their designation in the block diagram. Operation of this system will be better understood by considering a more amplified description of some of these blocks.

The reference voltage source 53, summing circuit 52 and limiting voltage amplifier 54 regulate the voltage on output terminal 31. Amplifier 54 functions as a high gain d-c error amplifier. Feedback network 55 controls the frequency response of the loop to stabilize the circuit and coact with amplifier 54 to attenuate the voltage ripple present on the voltage feedback line from attenuator 51 to prevent false triggering of the hysteretic switch 56. Typically, the high gain of voltage amplifier 54 makes the error signal so small that the attenuated voltage feedback provided by attenuator 51 is nearly equal to the reference voltage provided by reference voltage source 53.

The hysteretic switch 56 could be a magnetic circuit, typically comprising transformers having windings upon a toriodal core characterized by a rectangular hysteresis loop. Alternately, nonmagnetic circuits may be used, preferably integrated hysteretic circuits that perform the functions of comparable magnetic circuits while additionally facilitating simultaneously or independently switching the shifting thresholds.

The drive circuit 57 and power switch 35 are important for providing two-state power amplification. The input signal to drive circuit 57 from hysteretic switch 56 is a low level logic signal that directs opening or closing of the power switch. The drive circuit 57 processes the logic signal to provide control signals to the power switch for rapidly and efficiently changing the power switch state upon command. In an exemplary embodiment of the high voltage convertor/regulator the power switch comprises an array of power transistors.

Power feedback from power switch 35 to drive circuit 57 over power feedback line 58 occurs through pulse transformers incorporated in the circuitry coupling the drive circuit and power switch to enable the drive circuit to develop high drive currents efficiently. Additionally, the power feedback allows the drive current to track the current level in the power switch, thereby enhancing the efficiency of operation at low power levels.

By providing both positive turn-on current and negative turn-off current (in the case of NPN switching power transistors), the change between conducting and nonconducting states of the power switch occurs rapidly and efficiently. Turn-on current is supplied continuously during the interval when the power switch is on while turn-off current is supplied for the time required to render the power switch transistor nonconductive. The drive circuit provides both of these currents. Operation of the drive circuit is discussed below in greater detail in connection with the description of the specific circuit shown in FIG. 3.

The system of FIG. 2 includes three current sensors 37, 41 and 43. The inductive energy storage element 36 comprises a transformer with current flow alternating between primary and secondary and having two secondary output taps. The current sensors measure the currents flowing in each of the inductor windings. These measured currents are weighted so that when the output voltages from the current sensors are added in summing circuit 46, a continuous voltage signal is obtained which is representative of a normalized current flowing in a single reference winding and representative of the flux density in the linear inductor core, this flux density and the normalized current being proportionally related.

Figure 3:
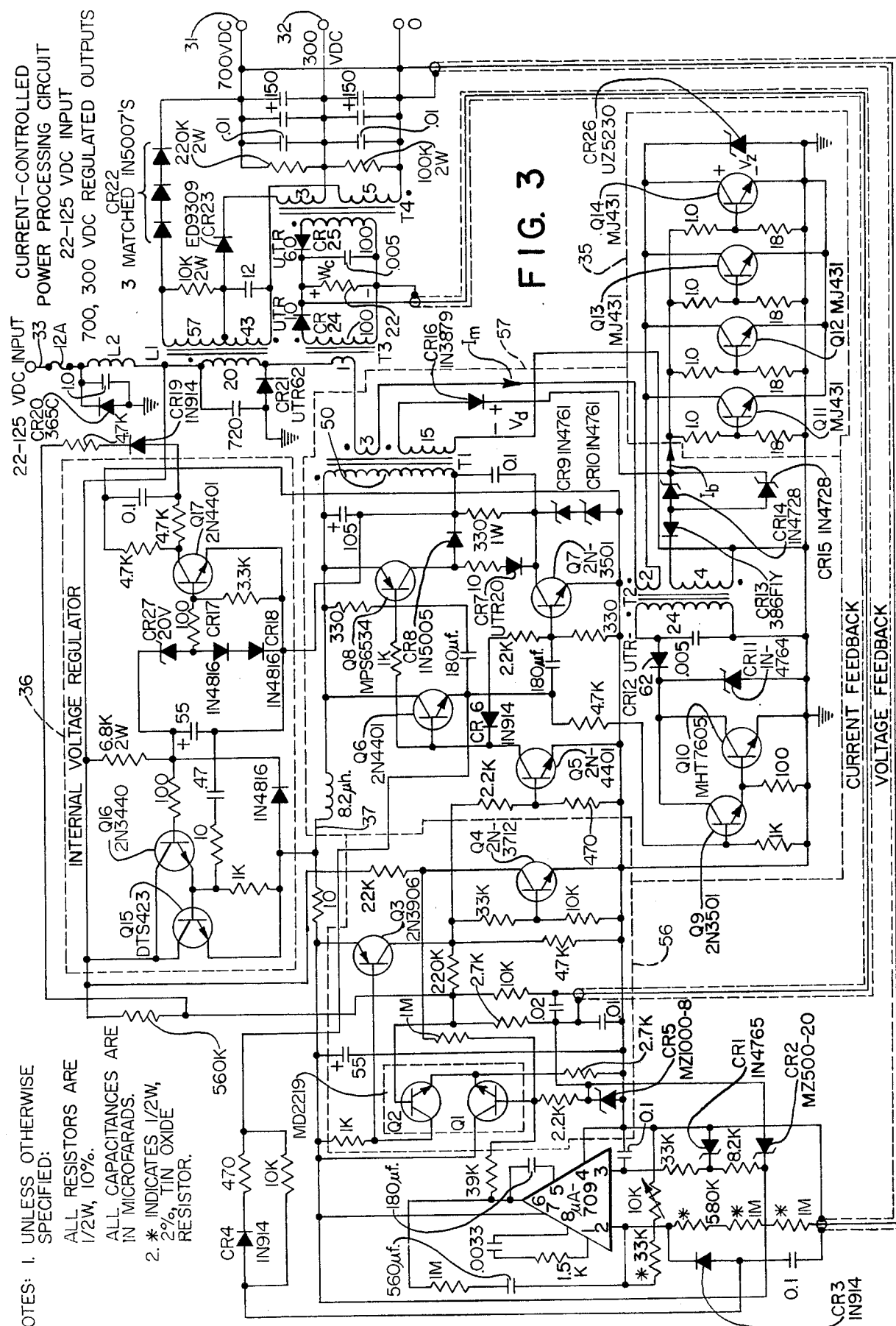
FIG. 3 is a schematic circuit diagram of a current-controlled power processing circuit corresponding to the block diagram of FIG. 2.

Referring to FIG. 3, there is shown a schematic circuit diagram of an actual working model of the system of FIG. 2 that receives 22–125 volts d-c on input terminal 33 and converts this input power into regulated output voltages of 700 volts d-c on output terminal 31 and 300 volts d-c on output terminal 32 highly regulated and current limited with an efficiency that is better than 80% for 50% of the rated load and of the order of 87% for 100% of the rated load, except at very low input voltages where the efficiency still remains above 80%. Since those skilled in the art may practice the invention by building the embodiment of FIG. 3, the description which follows omits details of conventional circuitry so as not to obscure the principles of the invention. FIG. 3 includes type identification of devices, parameter values and the number of turns on each transformer and inductor winding.

Transistors Q1, Q2, Q3, Q4 and associated circuitry comprise hysteretic switch 56. Feedback from the collector of transistor Q3 to the base of transistor Q2 contributes a hysteretic effect which is independent of the input supply voltage on line 37. Feedback from the collector of transistor Q4 to the base of transistor Q1 produces a hysteretic effect which is linearly dependent on the input supply voltage on line 37. By selecting an appropriate combination of feedback from transistor Q3 and Q4, this hysteretic effect can be made dependent on the supply voltage to a controlled degree. Because the hysteresis characteristic controls switching frequency and current ripple, its control with supply variations may be selected to provide the best efficiency for a wide range of input supply voltages. With the resistance values indicated in FIG. 3, the frequency increases from 12 kHz to 22 kHz depending upon the supply voltage. Current ripple in the power switch increases from 5 amperes to 10 amperes over this range.

Transistors Q5, Q6, Q7, Q8, Q9, Q10, diodes CR6–CR16, transformers T1 and T2 and associated resistors comprise the drive circuit 57. Transistors Q11, Q12, Q13, Q14 and associated circuitry comprise power switch 35.

Transistors Q7 and Q8 control turn-on transformer T1. When power transistors Q11–Q14 conduct, collector current flows through the 3-turn winding of transformer T1 to produce a current in the 15-turn winding thereof that flows through diode CR16 to the bases of transistors Q11–Q14. The turns ratio 3:15 produces a total base drive current which is one-fifth of the total collector current drawn by transistors Q11–Q14, this collector current passing through the 3-turn winding on transformer T1. This turns ratio is chosen to drive the output transistors just to saturation.

Transistor Q8 initiates turn-on of the power transistors when it begins to conduct by drawing a small current through the 50-turn winding of transistor T1 to produce a larger current in the 15-turn winding that injects the base current into the power transistors. Full turn-on occurs immediately thereafter, rapidly and regeneratively. As transistors Q11–Q14 begin to conduct, their collector current flows through The 3-turn winding of transformer T1 to produce an additional current in the 15-turn winding that increases the current flow in these transistors until they saturate.

To turn off the power transistors, the hysteretic switch 56 cuts off transistor Q7, thereby rendering transistor Q8 conductive. With transistor Q8 conducting the current that formerly flowed through the 50-turn winding of transformer T1 is diverted through transistor Q8 and diode CR8, virtually eliminating the turn-on drive current to transistors Q11–Q14. The circuit comprising transistors Q9, Q10 and diodes CR11–CR15 and turn-off transformer T2 functions to rapidly turn off transistors Q11–Q14 by providing large amounts of reverse base current during the turn-off interval. Operation of this circuit is as follows:

It is convenient to assume that transistors Q11–Q14 are initially conducting. Under normal current-on conditions, the Darlington circuit comprising transistors Q9 and Q10 is on so that current flowing through the two-turn winding of transformer T2 produces a current through the 24-turn winding that circulates through diode CR12 and transistor Q10. This current flow develops a small voltage across the 24-turn winding of transformer T2 that is stepped down across the 4-turn winding to a negligible value under these conditions. Diodes CR13–CR15 poled as shown assure that transformer T2 shunts no base drive current during the turn-on time.

During the turn-off interval, transistors Q9 and Q10 are turned off. Since transistors Q11–Q14 continue to conduct because of storage effects, current continues to flow through the two-turn winding of turn-off transformer T2. However, with transistors Q9 and Q10 cut off and presenting a high impedance across the 24-turn winding of transformer T2, the voltages across all the windings of transformer T2 rise rapidly until that across the 4-turn winding is large enough to withdraw current from the bases of transistors Q11–Q14 through diodes CR13–CR15.

Since the turns ratio of the four-turn winding in series with bases of the output transistors to the two-turn winding in series with the collectors of the output transistors is 4:2, the reverse current available from the four-turn winding of transformer T2 to withdraw base current is one-half the instantaneous collector current. Since this collector current can be as high as 12 amperes, the reverse turn-off base current can be as high as 6 amperes. Yet little power is wasted because all of the turn-off energy is obtained directly from the power switch transistor through a pulse transformer.

An important aspect of the transformer-coupled drive circuit is the provision for voltage reset to prevent saturation and maintain a relationship that the integral of the magnitude of Vdt is less than or equal to $NAB_m$ where V is a winding voltage, N is the number of turns of the winding, A is the cross-sectional area of the core and $B_m$ is the maximum permissible flux level in the core to prevent saturation.

To insure meeting this constraint, each transformer coupled circuit includes means for establishing a voltage reset phase. During a portion of each cycle, externally applied voltage constraints are removed from the transformer windings to translate the voltage to a level which reduces the flux density within the transformer core. Magnetizing current flowing in the transformer windings produces this voltage translation. During the reset period, the voltages appearing across the transformer windings are large in comparison to voltages applied to the transformer at alternate periods. The use of large reset voltages reduces the flux density quickly, thereby enabling the reset period and duty cycle to decrease relative to the total switching period and duty cycle of the convertor/regulator.

For the high voltage unit, the turn-on drive transformer T1 alternates between two conditions. The first of these is the drive condition when drive current is supplied through transformer T1 to transistors Q11–Q14. The second of these is the reset condition when the flux density in the core is reset to zero.

Preferably the power transistors Q11–Q14 are on for as much as 90% of the total switching period; hence, transformer T1 must be reset during the remaining 10% of the total switching period. This may be accomplished if the reset voltages are at least 10 times larger than the drive voltages. That is to say, the ratio of reset voltages to drive voltages is at least as large as the ratio of total switching period to the power transistor off period when resetting may occur. As a practical matter, it is advantageous to establish the ratio of reset voltages to drive voltages as 20–30 to provide a margin to safety to insure that the transformer is completely reset.

Zener diodes CR9 and CR10 function to limit the magnitude of the transformer voltages during the reset period for transformer T1. Limiting the reset voltages prevents avalanche breakdown of drive transistor Q7 and diodes CR7, CR8 and CR16. In a similar manner, turn-off drive transformer T2 is reset when transistors Q9–Q14 are off.

Transistors Q11–Q14 comprise a power switch capable of switching 12 amperes with voltages up to 300 volts. With the MJ431 transistors shown reliable switching to 300 volts with current fall time of less than one microsecond is obtainable.

When the power transistors turn off, the leakage inductance of inductor L1 develops a spike that may damage the power transistors Q11–Q14. Zener diode CR26 functions as a voltage limiter to prevent the spike from exceeding 300 volts and damaging the power transistors.

Inductor L1 functions to provide inductive energy storage. When the power switch is on, energy is stored in the 20-turn winding and transferred to the output via the 100-turn winding when the power switch is off. Thus, current flow alternates between the two windings of the inductor.

Inductor L1 was wound upon a parallel configuration of two molybdenum permalloy powder toroidal cores with 20 turns of number 10 litz wire forming the primary winding closest to the core and a hundred turns of thin wall teflon jacketed number 22 stranded wire forming the secondary to maintain the spacing between turns with the winding capacitance low.

Transformers T3 and T4 and diodes CR24 and CR25 comprise current sensors 37, 41 and 43. These transformers function as current transformers to produce a current flow through the 22 ohm resistor that is proportional to the currents flowing in the primary windings of the transformers. Diodes CR24 and CR25 function to reset these transformers whenever the currents flowing in the primary windings of one of the transformers are zero, these diodes being controlled avalanche fast recovery diodes.

The voltage then appearing across the 22 ohm resistor, $V_c$, is proportional to the currents flowing in inductor L1. However, no single current waveform in the power circuit has the waveshape of voltage $V_c$. The voltage $V_c$ is proportional to a sum of currents weighted so that it is a measure of the flux density within the linear magnetic core material of inductor L1. As such, the control voltage $V_c$ is proportional to an imaginary current that would flow in a single imaginary winding of inductor L1 to produce a flux in the core that actually exists as a result of currents flowing in the two windings of inductor L1.

The voltage $V_c$ performs a dual function in the operation of the converter/regulator. This sawtooth waveform voltage is used to initiate high frequency switching in cooperation with the hysteretic switch to provide two-state operation. In addition it limits current levels because limiting voltage amplifier 54 cannot demand excessive levels of voltage $V_c$, and $V_c$ is proportional to the levels.

Figure 4:
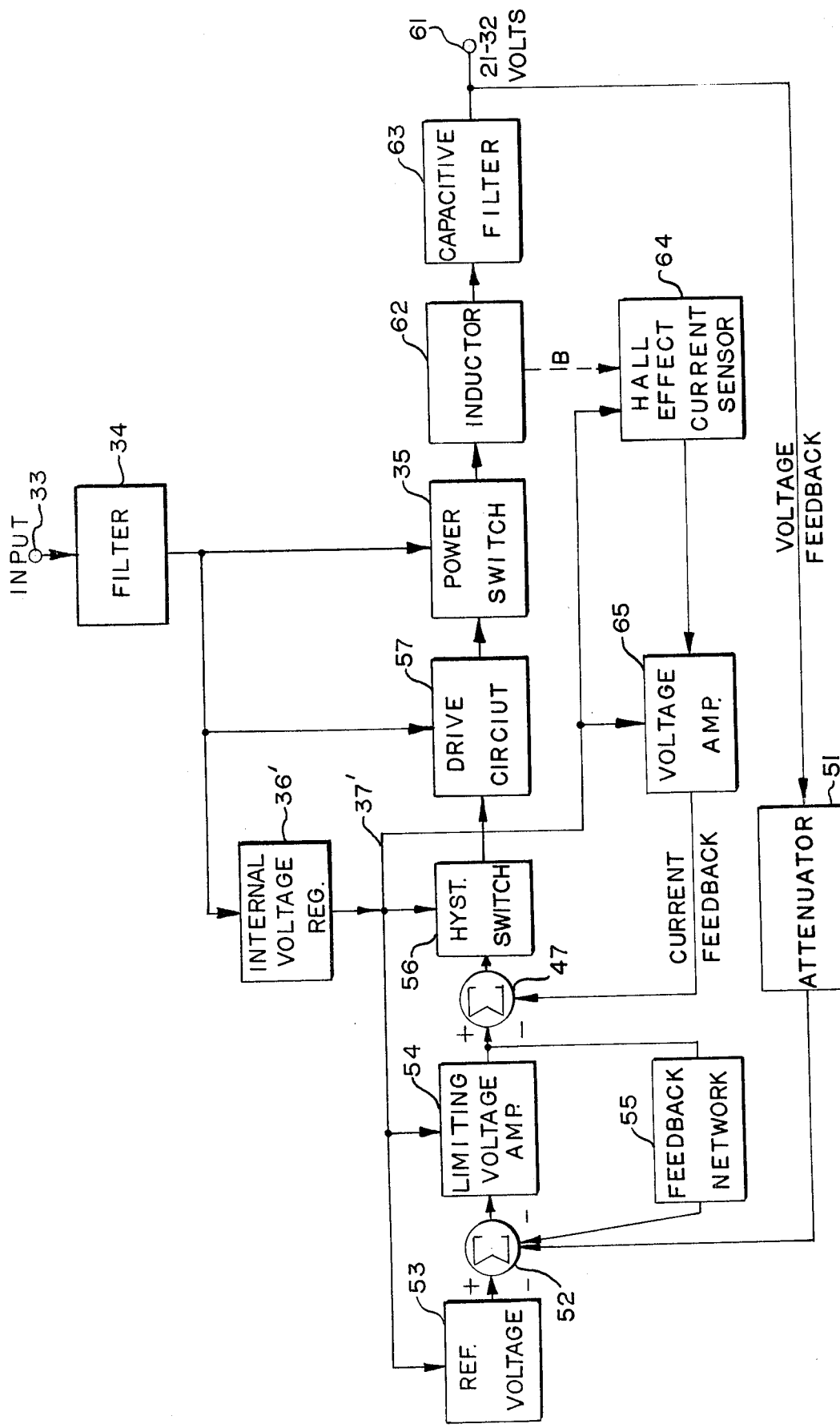
FIG. 4 is a block diagram illustrating the logical arrangement of a current controlled voltage limiter according to the invention.

Referring to FIG. 4, there is shown a block diagram illustrating the logical arrangement of a voltage limiter/regulator according to the invention. Since this embodiment of the invention is logically similar to the system of FIG. 2, corresponding elements are designated by the same reference symbols. Power switch 35 delivers power to output terminal 61 through an inductor 62 and capacitive filter 63. A Hall effect current sensor 64 provides a voltage proportional to the current in inductor 62 that is amplified by voltage amplifier 65 to provide the current feedback signal to the minus input of summing circuit 47.

Figure 5:
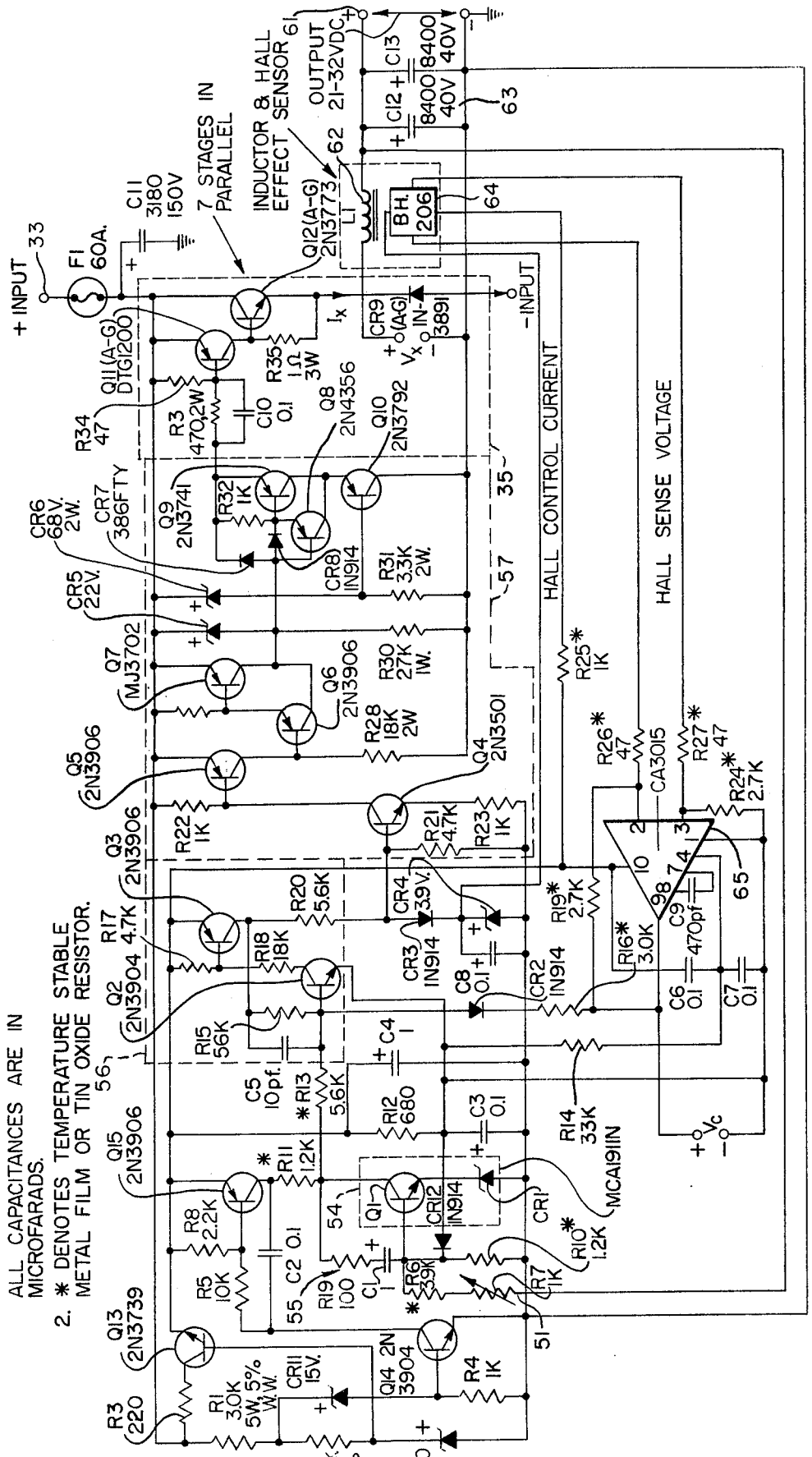
FIG. 5 is a schematic circuit diagram of a current controlled voltage limiter/regulator corresponding to the block diagram of FIG. 4.

Referring to FIG. 5, there is shown a schematic circuit diagram of the system of FIG. 4. Since those skilled in the art may practice the invention by building this circuit with the components indicated, the dicussion which follows briefly describes particular aspects helpful in understanding its principles of operation. For simplicity in following this description, the transistors and diodes in this circuit are designated by Q, CR and an associated order number commencing with one to facilitate following the description of this circuit, it being apparent that the discussion which follows refers to the circuit of FIG. 5 and not that of FIG. 3.

Zener diode CR1 and transistor Q1 comprise a voltage reference amplifier package which functions as a source of a reference voltage and provides voltage amplification with exceptionally stable temperature characteristics. The RC feedback network from the collector to the base of transistor Q1 attenuates high frequency ripple voltages at the collector of transistor Q1.

Transistors Q2 and Q3 comprise a complementary on-on flip-flop that functions as a high input impedance, relatively low output impedance hysteretic circuit.

Transistors Q4-Q10 comprise the drive circuit for the output power switch. Transistor Q4 provides a two-state current signal to transistor Q5 which inverts and amplifies the two-state signal. Transistors Q6 and Q7 function as a push-pull Darlington drive stage to provide proper charge-controlled operation of the power switch input transistors Q11A-Q11G through the parallel RC networks. The remaining transistor Q10 functions to limit the voltage applied to the other Darlington drive transistors Q8 and Q9. Zener diode CR6 limits the emitter voltage of transistor Q10 to approximately 68 volts.

The power switch 35 comprises transistors Q11A-Q11G, Q12A-Q12G and diodes CR9A-CR9G. Seven parallel complementary Darlington stages comprise PNP transistors Q11A-Q11G and silicon NPN output transistors Q12A-Q12G. The Germanium devices are adequate to allow input voltages of 120 volts d-c while the silicon NPN power transistors operate reliably with no second breakdown.

Inductor L1 is assembled to provide the required inductance for the voltage limiter/regulator with minimum size and weight. A gapped C core arrangement is used with four mil silicon steel material having a saturation flux density of 17,600 Gauss. The inductor functions as a linear element to 80 amperes and is wound with flat copper strips to provide optimum utilization of the core window area and therefore lowest resistance. Typical acceptable specifications are 0.745 mH. at 70 amperes with 0.006 ohms resistance. Its weight was but 6.5 pounds with a volume of only 23 cubic inches. For higher switching frequency, the size of the inductor may be considerably reduced because smaller components may perform effective filtering at the higher frequencies.

A "Hall effect" flux sensor is inserted into the air gap in the C core to provide an output sense voltage signal proportional to the flux density in the core. Since the inductor is a linear element, the flux density in the core is directly proportional to the current flowing through the inductor so that the Hall sense voltage is a direct measure of the current flowing through the inductor L1.

The Hall sense voltage is in the millivolt range and amplified by monolithic operational amplifier CA3015 that provides the output voltage, $V_c$, proportional to the instantaneous current flow in the inductor.

Transistors Q13-Q15 comprise an internal voltage regulator circuit for providing a fixed output voltage in the order of 12 volts to the low level circuits. Transistors Q14 and Q15 additionally form a starting control circuit to prevent conduction in the output power transistors Q11A-Q11G and Q12A-Q12G when the input supply voltage is below the normal operational voltage range; that is, below 21 volts d-c. Then the output transistors are held nonconducting through the action of this circuit. When the input supply voltage rises to 22 volts d-c, the starting circuit enables the low level circuits and therefore the output power transistors to begin active operation.

There has been described a novel two-state current control system characterized by numerous advantages. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Signal translation apparatus comprising,
   a two-state device having means for establishing a hysteresis characteristic and including an input and an output for providing one of first and second output levels and shifting to the other only in response to a predetermined shift in the level on said input across one of first and second different threshold levels,
   an input terminal for receiving an external signal,
   means for combining a current feedback signal of frequency corresponding to the rate at which the shift between said first and second levels occurs representative of the current delivered by said output with a signal related to that applied to said input terminal to provide a combined signal at the combining means output of frequency corresponding to said rate,
   means for coupling the output of said combining means to said input to shift said two-state device output between said first and second levels when said combined signal crosses said first and second threshold levels respectively whereby the signal at said output includes a characteristic representative of the signal at said input terminal,
   said output signal characteristic being its average value over a cycle,
   averaging means,
   means for coupling said two-state device output to said averaging means to provide a signal having a waveform corresponding substantially to that of the signal then received by said input terminal,
   said means for coupling including essentially nondissipative means for blocking spectral components of the energy at said two-state device output from said averaging means which spectral components are of frequency at least as high as the rate at which the shift between said first and second levels occurs,
   means for providing a voltage feedback signal representative of a signal provided by said averaging means,
   and means for coupling said voltage feedback signal to said means for combining to provide said combined signal that is related to said current feedback signal, the signal applied to said input terminal, and said voltage feedback signal.

2. Signal translation apparatus in accordance with claim 1 wherein said means for coupling comprises inductive means.

3. Signal translation apparatus in accordance with claim 1 wherein said means for coupling said voltage feedback signal to said means for combining includes,
   limiting means for providing an output signal that is proportional to its input up to a predetermined limiting value and thereafter of substantially constant limited amplitude,
   means for combining the signal on said input terminal with said voltage feedback signal to provide a limitable combined signal,
   means for coupling said limitable combined signal to siad limiting means,
   and means for coupling the output of said limiting means to said first-mentioned means for combining to provide said combined signal.

4. Signal translation apparatus in accordance with claim 1 and further comprising at least first and second current sensing means intercoupled by said essentially nondissipative means for providing at least first and second current signals,
   and means for combining said at least first and second current signals for providing said current feedback signal.

5. Signal translation apparatus in accordance with claim 4 wherein said first and second current sensing means comprise first and second transformers each having at least a primary and a secondary winding,
   and means for intercoupling said secondary windings to provide said current feedback signal.

6. Signal translation apparatus in accordance with claim 5 wherein said means for intercoupling said secondary windings comprises first and second unilaterally conducting devices providing said current feedback signal at their junction.

7. Signal translation apparatus in accordance with claim 1 wherein said means for coupling said voltage feedback signal to said means for combining includes means for reducing the ripple in said voltage feedback signal that is transmitted to said combining means.

8. Signal translation apparatus comprising,
   an output terminal,
   sources of first and second output signal levels,
   a switching signal terminal,
   switching means for coupling said first and said second output signal levels to said output terminal during mutually exclusive time intervals in response to a predetermined shift in the level of a switching signal on said switching signal terminal across one of first and second different threshold levels,
   an input terminal for receiving an input signal,
   combining means for providing said switching signal by combining a signal related to that on said input terminal with a current feedback signal,
   feedback means responsive to the current delivered from said sources through said switching means to said output terminal for providing said current feedback signal representative of said current with cyclical variations synchronously related to those of said current delivered to said output terminal,
   averaging means coupled to said output terminal for providing a signal related to the ratio of time said first signal level is provided on said output terminal to the time said second signal level is provided on said output terminal,
   means for providing a voltage feedback signal representative of a signal provided by said averaging means,
   and means for coupling said voltage feedback signal to said combining means to provide said switching signal of frequency the same as said cyclical variations that is related to that on said input terminal, said current feedback signal and said voltage feedback signal for establishing said first and second output levels on said output terminal when said switching signal crosses said first and second threshold levels respectively.

9. Signal translation apparatus in accordance with claim 8 wherein said means for coupling said output terminal to said averaging means includes essentially nondissipative means for blocking spectral components of the energy on said output terminal from said averaging means which spectral components are at least as high as the rate at which cycles of said interruption occur.

10. Signal translation apparatus in accordance with claim 8 wherein the last-mentioned means for coupling comprises energy storage means for transferring many times more energy from said output terminal to said averaging means than said energy storage means dissipates.

11. Signal translation apparatus in accordance with claim 10 wherein said energy storage means comprises an inductor.

12. Signal translation apparatus in accordance with claim 8 wherein said means for coupling said voltage feedback signal to said combining means comprises, limiting means for providing an output signal on its output proportional to an input signal applied to its input up to a predetermined limiting amplitude and thereabove of substantially constant limited amplitude, means for combining said voltage feedback signal with said input signal to provide a limitable combined signal, means for coupling said limitable combined signal to the input of said limiting means, and means for coupling the output of said limiting means to said first-mentioned combining means.

13. Signal translation apparatus in accordance with claim 8 and further comprising a low pass filter coupled to said output terminal for receiving said current therefrom, and said means for providing a current feedback signal comprises current sensing means for providing a current feedback signal representative of the current flowing between said switching means and said low pass filter.

14. Signal translation apparatus in accordance with claim 8 and further comprising means for coupling at least one of said sources of first and second output signal levels to said switching means for controlling the rate at which switching occurs in accordance with the magnitude of the level provided by the said at least one of said sources.

15. Signal translation apparatus in accordance with claim 8 wherein said switching means comprises, a hysteretic switch energized by said means for combining for controlling its state, drive circuit means energized by said hysteretic switch for driving a power switch, said power switch energized by said drive circuit means for having its state controlled thereby, and means for feeding back a signal from said power switch to said drive circuit means for developing high drive currents efficiently and allowing the drive current to track the current level in the power switch.

16. Signal translation apparatus in accordance with claim 15 and further comprising means for delivering turn-on and turn-off currents of opposite polarity to said power switch to turn said power switch on and off respectively.

17. Signal translation apparatus in accordance with claim 16 and further comprising means for supplying said turn-on current continuously during the interval said power switch is on, and means for supplying turn-off current to said power switch only for the time interval required to render said power switch nonconductive.

18. Signal translation apparatus in accordance with claim 15 wherein said hysteretic switch comprises first, second, third and fourth transistors each having at least emitter, base and collector electrodes, means for intercoupling the emitters of said first and second transistors, means for intercoupling the first transistor collector and the third transistor base, means for intercoupling said third transistor collector and said fourth transistor base, and means for feeding back a signal from said third transistor collector to said first transistor base for establishing the hysteresis characteristic of said hysteretic switch independent of the d-c supply voltage received by said transistors.

19. Signal translation apparatus in accordance with claim 18 and further comprising, means for coupling a feedback signal from the collector of said fourth transistor to the base of said first transistor for producing a hysteretic effect which is linearly dependent upon said input supply voltage, whereby the feedback from said third and fourth transistors may coact to establish a relationship between hysteretic effect and supply voltage to a controlled degree.

* * * * *